United States Patent
Puckett et al.

(10) Patent No.: US 11,524,359 B2
(45) Date of Patent: Dec. 13, 2022

(54) LOW TEMPERATURE DIRECT BONDING OF ALUMINUM NITRIDE TO ALSIC SUBSTRATES

(71) Applicant: Georgia Tech Research Corporation, Atlanta, GA (US)

(72) Inventors: Waylon Puckett, Atlanta, GA (US); Darshan G. Pahinkar, Atlanta, GA (US); Samuel Graham, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 231 days.

(21) Appl. No.: 16/639,859

(22) PCT Filed: Aug. 23, 2018

(86) PCT No.: PCT/US2018/047760
§ 371 (c)(1),
(2) Date: Feb. 18, 2020

(87) PCT Pub. No.: WO2019/040753
PCT Pub. Date: Feb. 28, 2019

(65) Prior Publication Data
US 2020/0262000 A1    Aug. 20, 2020

Related U.S. Application Data

(60) Provisional application No. 62/549,123, filed on Aug. 23, 2017.

(51) Int. Cl.
*B23K 1/00* (2006.01)
*B23K 20/02* (2006.01)
(Continued)

(52) U.S. Cl.
CPC ............ *B23K 20/02* (2013.01); *B23K 1/0008* (2013.01); *B23K 1/0016* (2013.01);
(Continued)

(58) Field of Classification Search
CPC ............ B23K 2101/40; B23K 2103/52; B23K 1/0008; B23K 1/0016;
(Continued)

(56) References Cited

U.S. PATENT DOCUMENTS 6,033,787 A * 3/2000 Nagase .................. B32B 15/04
428/545
6,310,775 B1 * 10/2001 Nagatomo ........... H05K 1/0271
361/707

(Continued)

FOREIGN PATENT DOCUMENTS

| CN | 104551382 | | 9/2016 |
| JP | 10065075 A | * | 3/1998 |
| JP | 2001019567 A | * | 1/2001 |
| JP | 2017183716 A | * | 10/2017 |
| WO | 20140228336 | | 2/2014 |

OTHER PUBLICATIONS

Machine translation of JP-2001019567-A (no date available).*
International Search Report and Written Opinion from application No. PCT/US2018/47760 dated Dec. 7, 2018 (11 pages).

*Primary Examiner* — Kiley S Stoner
(74) *Attorney, Agent, or Firm* — Troutman Pepper Hamilton Sanders LLP; Ryan A. Schneider

(57) ABSTRACT

Disclosed herein are power electronic modules formed by directly bonding a heat sink to a dielectric substrate using transition liquid phase bonding.

33 Claims, 9 Drawing Sheets

(51) Int. Cl.
*H01L 21/48* (2006.01)
*H01L 23/373* (2006.01)
*B23K 103/00* (2006.01)
*B23K 101/40* (2006.01)

(52) U.S. Cl.
CPC ...... *H01L 21/4882* (2013.01); *H01L 23/3735* (2013.01); *B23K 2101/40* (2018.08); *B23K 2103/52* (2018.08)

(58) Field of Classification Search
CPC .. B23K 2101/36–42; B23K 20/02–026; H01L 21/4882; H01L 23/3735; C04B 2235/96; C04B 2237/121; C04B 2237/124; C04B 2237/36; C04B 2237/365; C04B 2237/366; C04B 2237/704; C04B 2237/708; C04B 2237/72; C04B 37/006
USPC ......... 228/245–255, 193–195, 179.1–180.22

See application file for complete search history.

(56) References Cited

U.S. PATENT DOCUMENTS

| | | | |
|---|---|---|---|
| 2002/0089828 A1* | 7/2002 | Suzuki | H01L 24/29 361/709 |
| 2004/0022029 A1* | 2/2004 | Nagatomo | H01L 24/32 361/709 |
| 2006/0087181 A1* | 4/2006 | Kusumi | H02J 7/0042 310/68 D |
| 2006/0163605 A1* | 7/2006 | Miyahara | C04B 35/58 257/103 |
| 2013/0201631 A1 | 8/2013 | Parker et al. | |
| 2014/0028336 A1 | 1/2014 | Lee et al. | |
| 2014/0197533 A1* | 7/2014 | Imamura | H01L 24/92 257/712 |
| 2015/0221626 A1* | 8/2015 | Motowaki | H01L 24/49 257/712 |
| 2016/0254209 A1* | 9/2016 | Oohiraki | H01L 23/12 257/707 |
| 2017/0104135 A1 | 4/2017 | Shur et al. | |
| 2017/0110341 A1* | 4/2017 | Onoda | H01L 25/07 |
| 2018/0277729 A1* | 9/2018 | Nagase | H01L 23/36 |

* cited by examiner

1. Cu - Al Diffusion

2. Transient Liquid Phase

3. Solidification at high temperature

LOW TEMPERATURE DIRECT BONDING OF ALUMINUM NITRIDE TO ALSIC SUBSTRATES

CROSS-REFERENCE TO RELATED APPLICATION

This Application claims priority under 35 U.S.C. § 119(e) to U.S. Provisional Patent Application No. 62/549,123, filed Aug. 23, 2017, the contents of which is hereby incorporated in its entirety as if fully set forth herein.

STATEMENT REGARDING FEDERALLY SPONSORED RESEARCH

This invention was made with government support under W911NF-16-2-0088 awarded by the U.S. Army Research Laboratory. The government has certain rights in the invention.

TECHNICAL FIELD

This disclosure relates generally to composites comprising power electronic modules and related methods. In particular, this disclosure relates to providing a power module and related methods that can reduce the thermal resistance caused by multiple intermediate layers with varying coefficients of thermal expansion.

BACKGROUND

Conventional power electronic modules typically employ a direct bond copper (DBC) substrate, three layers of thermal interface materials (TIM), a copper heat spreader, and a heat sink to dissipate heat. The DBC consists of an electrical insulator ceramic such as aluminum nitride (AlN) sandwiched on both sides with thick copper (Cu). The presence of multiple layers, contact resistances and low thermal conductivity thermal grease causes two major issues. First, the thermal resistance from device to heat sink remains high, thereby limiting the device power dissipation for a given operating temperature. Secondly, the fatigue performance of the complete package remains poor due to coefficient of thermal expansion (CTE) mismatch between adjacent layers. For example, Cu in DBC has a CTE of $16 \times 10^{-6}$ $C.^{-1}$, whereas the same for AlN is $4.5 \times 10^{-6}$ $C.^{-1}$, a ~4× difference. Therefore, as the complete power electronic package is subjected to thermal cycles, an interfacial stress develops at the Cu—AlN boundary. This stress can initially cause deformation, warpage and delamination at the interface and eventually failure of the device. The poor thermal stress performance of DBC in the power electronic package has been widely reported in the literature with DBC having been documented to fail after as few as 100 thermal cycles that range from −40° C. to 150° C.

While Cu base plates and Al heat sinks along with direct bonded aluminum (DBA) and DBC are used conventionally, their CTE values remain high compared to others. Furthermore, DBC is typically fabricated using an oxidizing atmosphere at temperatures above 1070° C. and this high processing temperature can result in large residual stresses being induced in the DBC at room temperature, which adds to the driving force for delamination during temperature cycling of the power electronics substrate, leading to lower reliability.

SUMMARY

Disclosed herein are organic-inorganic composite materials and methods of making and using the same. In some embodiments, the composite materials comprise a first cementitious layer comprising a first inorganic fiber, a first organic fiber, or a mixture thereof, a second cementitious layer comprising a second inorganic fiber, a second organic fiber, or a mixture thereof, a composite core having a first planar surface and a second planar surface opposite the first planar surface, wherein the first cementitious layer is in physical communication with the first planar surface, and wherein the second cementitious layer is in physical communication with the second planar surface.

In some embodiments, the power electronic modules comprise a dielectric substrate and a heat sink attached to the dielectric substrate, wherein the heat sink includes a mixed matrix composite.

In some embodiments, the power electronic modules comprise a dielectric substrate and an aluminum alloy heat sink attached to the dielectric substrate, wherein the dielectric substrate and the aluminum alloy heat sink are attached by a bonding material, and wherein the heat sink includes a mixed matrix composite In some embodiments, the power electronic modules comprise a dielectric substrate, such as AlN and an aluminum alloy heat sink, such as AlSiC, attached to the dielectric substrate, wherein the heat sink includes a mixed matrix composite.

In some embodiments, the power electronic modules comprise a dielectric substrate and an aluminum alloy heat sink attached to the dielectric substrate, wherein the thermal expansion coefficient of the dielectric substrate is approximately the same as the thermal expansion coefficient of the aluminum alloy heat sink, and wherein the dielectric substrate and the aluminum alloy heat sink are attached by a bonding material.

In some embodiments, the power electronic modules comprise a dielectric substrate and an aluminum alloy heat sink attached to the dielectric substrate, wherein the thermal expansion coefficient of the dielectric substrate is approximately the same as the thermal expansion coefficient of the aluminum alloy heat sink, and wherein the dielectric substrate and the aluminum alloy heat sink are attached by a bonding material, and wherein the bonding material includes a transition liquid phase alloy.

In some embodiments, a method of manufacturing a power electronic module comprises depositing a dielectric substrate, an aluminum alloy heat sink, and a bonding material into a mold, and heating the mold to 550°-580° C.

In some embodiments, a method of manufacturing a power electronic module comprises depositing a dielectric substrate, an aluminum alloy heat sink, and a bonding material into a mold, and heating the mold to 565° C.

In some embodiments, a method of manufacturing a power electronic module comprises depositing a dielectric substrate, such as AlN, an aluminum alloy heat sink, such as AlSiC, and a bonding material, such as an Al—Cu eutectic, into a mold, and heating the mold to 550°-580° C.

In some embodiments, a method of manufacturing a power electronic module comprises depositing a dielectric substrate, such as AlN, an aluminum alloy heat sink, such as AlSiC, and a bonding material, such as an Al—Cu eutectic, into a mold, and heating the mold to 565° C.

BRIEF DESCRIPTION OF THE DRAWINGS

Reference will now be made to the accompanying figures, which are not necessarily drawn to scale, and wherein.

DETAILED DESCRIPTION

Figure 1:
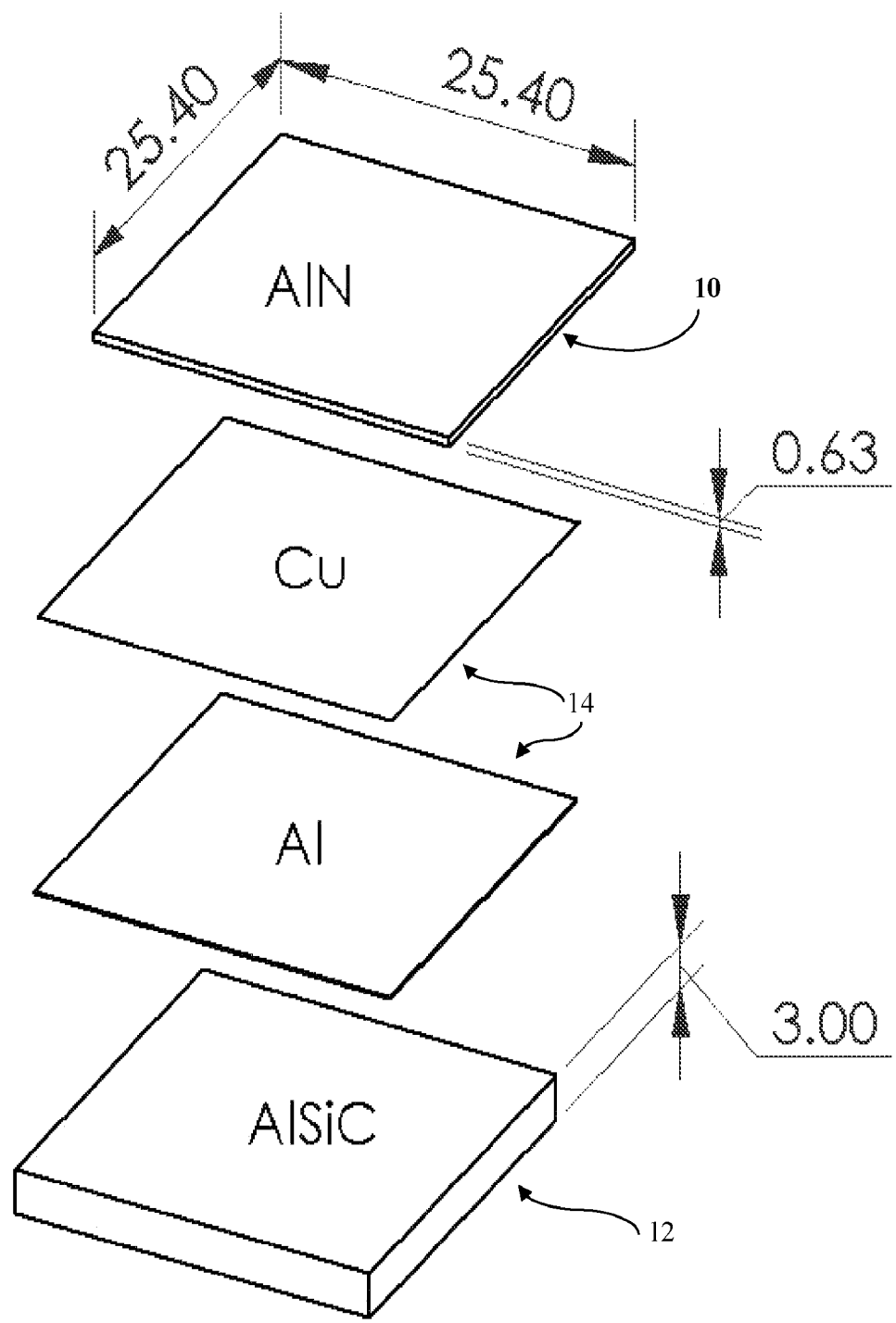
FIG. 1 depicts an embodiment of the components of a power electronics module disclosed herein, not necessarily drawn to scale.

Although preferred embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. The disclosure is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" one particular value and/or to "about" or "approximately" another particular value. When such a range is expressed, another embodiment includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Disclosed herein are power electronic modules and methods of making the same. Disclosed herein are power electronic modules that can reduce the thermal resistance caused by multiple intermediate layers with varying coefficients of thermal expansion. Also disclosed herein is a method of manufacturing a power electronic module including directly bonding a dielectric substrate to a heat sink through transient liquid phase bonding using an Al—Cu binary system or eutectic. The resulting power modules exhibit good interfacial adhesion. The manufacturing process enables smaller, lighter, and more reliable power modules.

In a first aspect, FIG. 1 depicts an embodiment of a power module in which a dielectric substrate 10 is attached to an aluminum alloy heat sink 12 with bonding between the dielectric substrate 10 and the heat sink 12 as shown in FIG. 1. The bonding is formed by application of a bonding material 14.

An improvement in distortion between the dielectric substrate 10 and the heat sink 12 can be due to the similarities between the thermal expansion coefficients between the dielectric substrate 10 and the heat sink 12 in the power module according to the first aspect of the present invention. Accordingly, internal stress generated in the dielectric substrate 12 is reduced thereby to suppress the load caused by thermal stress.

The dielectric substrate disclosed herein can include aluminum nitride (AlN), silicon nitride ($Si_3N_4$), aluminum oxide ($Al_2O_3$), any comparable semiconducting material with a suitable coefficient of thermal expansion (CTE), or combinations thereof. In some embodiments, the AlN is amorphous. In some embodiments, the dielectric substrate can have a CTE from 3.3 to 8.5 microns/m/° C.

The heat sink disclosed herein can include a copper alloy, an aluminum alloy, combinations thereof, and the like. In some embodiments, the heat sink includes a mixed matrix composite. A mixed matrix composite can include at least two component parts, wherein one component part is suspended in or reinforcing the other component part. (e.g. an aluminum matrix with suspended SiC particles). The suspended particles limit thermal expansion of the composite. In some embodiments, the heat sink includes AlSiC or some variant thereof. In some embodiments, the thickness of the heat sink is from 2.5 mm to 5 mm (e.g. 3 mm, 3.5 mm, 4 mm, 4.5 mm). In some embodiments, the heat sink or mixed matrix composite can have a CTE from 6.5 to 9.5 microns/m/° C.

The bonding material disclosed herein can include Al—Cu, Al—Mg, Al—Si, Al—Ni, Al—Ag, Al—Ce, combinations thereof, and the like. In some embodiments, the bonding material includes an Al—Cu eutectic. In some embodiments, the Al—Cu eutectic comprises about 17 wt % Cu and 81 wt % Al. In some embodiments, the thickness of the aluminum in the bonding material can be from 0.03 mm to 1 mm (e.g. 0.04 mm, 0.05 mm, 0.06 mm, 0.07 mm, 0.08 mm, 0.09 mm). In some embodiments, the thickness of the copper in the bonding material can be from is 0.01 mm to 0.02 mm (e.g. 0.015 mm, 0.0175 mm, 0.019 mm). Once melted and dried, the thickness of the bonding material can be from 30 μm to 180 μm (e.g. 40 μm, 50 μm, 60 μm, 70 μm, 80 μm, 90 μm, 100 μm, 110 μm, 120 μm, 130 μm, 140 μm, 150 μm, 160 μm, 170 μm).

In some embodiments, the area of the power module can be from 20 mm by 30 mm to 50 mm by about 50 mm (e.g. 22 mm by 30 mm, 25 mm by 30 mm, 27 mm by 30 mm, 30 mm by 30 mm, 35 mm by 35 mm, 35 mm by 40 mm, 40 mm by 40 mm, 45 mm by 45 mm, 45 mm by 50 mm).

Figure 2:
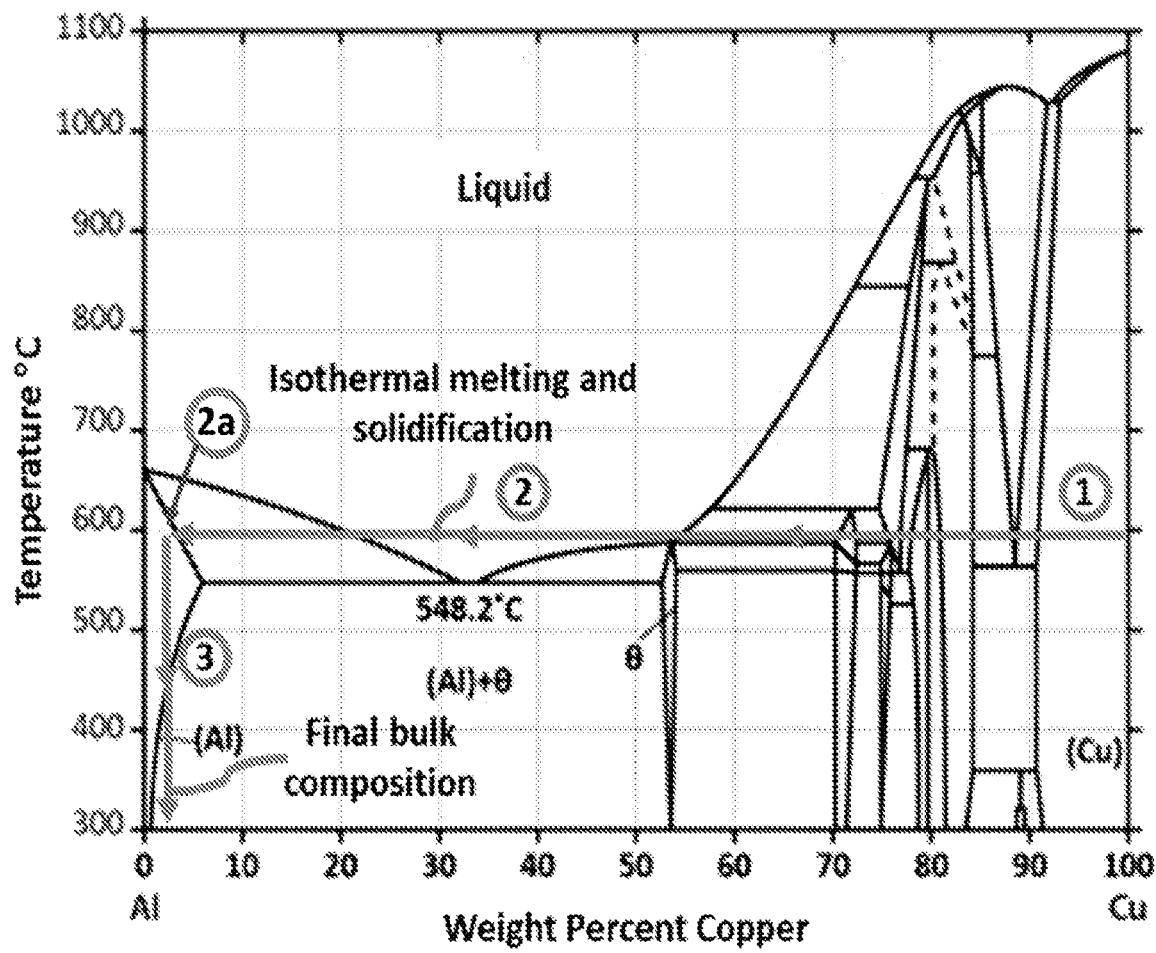
FIG. 2 depicts binary phase diagram for the bonding material.
Figure 2:
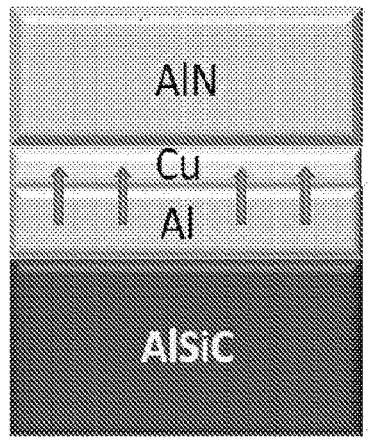
Figure 2:
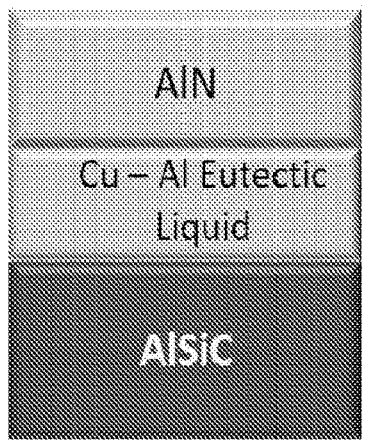
Figure 2:
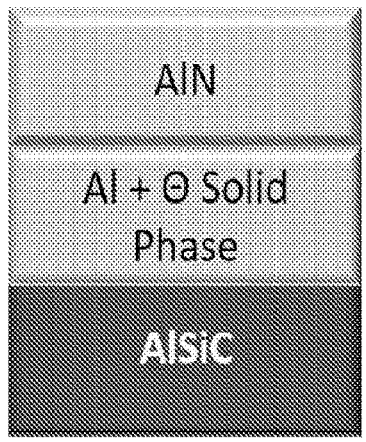

In some embodiments, to create the power module, the dielectric substrate, the heat sink, and the bonding material is deposited into a mold. The mold can be equipped to apply force on the participating layers. Application of clamping force in the mold greater than 2 kN (e.g. 3 kN, 4 kN, 5 kN) helps make effective bonds. In some embodiments, transient liquid phase (TLP) bonding is used to create the bond between the dielectric substrate and the heat sink at temperatures from 550° C.-600° C. (e.g. 550° C.-580° C., 555° C., 560° C., 565° C., 570° C., 575° C., 580° C., 585° C.). In some embodiments, the key process enabling the bond between the AlN and the AlSiC was a transient liquid phase (TLP) bonding process using an Al—Cu eutectic, which is shown in FIG. 2. In some embodiments, this process entails putting two different metals (e.g. Al, Cu) in contact using a specific bulk ratio, and heating them above the eutectic point, but below the melting temperature of the individual metals. Initially during the heating process, both metals remain solid as they diffuse into each other. Eventually the composition reaches the liquid regime, allowing a transient liquid state to form.

EXAMPLES

The following examples are illustrative, but not limiting, of the methods and compositions of the present disclosure. Other suitable modifications and adaptations of the variety of conditions and parameters normally encountered in the field, and which are obvious to those skilled in the art, are within the spirit and scope of the disclosure.

Example 1: Power Module Fabrication

The bonds were made by using Al and Cu foils in 5:1 ratio between an AlN ceramic and an AlSiC base plate. The use of foils made the process fairly simple and inexpensive. The AlSiC layer also had a cover layer of Al 356 alloy (from 50 to 80 μm thick) on the bulk AlSiC, which had 6.5-7.5% Si by weight. The initial composition of the bond based on the Al and Cu layer and the Al 356 layer was 77.9% Al, 20.2% Cu, and 1.9% Si by weight. The stack sequence was chosen such that the surface contacting the AlN would initially be pure Cu, and the composition would change according to the arrow shown in FIG. 1. This forced the layer directly next to the AlN to pass fully through the liquid regime minimizing possibilities of unbonded areas.

In order to ensure that there were no contaminants within the bond, all the participating layers shown in FIG. 1 were first cleaned with a 25% hydrochloric acid (HCl) solution at room temperature, followed by being rinsed with deionized (DI) water, and isopropanol or acetone. The HCl solution helped in minimizing aluminum oxide, which may have formed on the Al and AlN, while not affecting the bulk AlN. After cleaning each layer, the stack was placed in a graphite rig or mold. The rig was tightened to hold the samples in place using a clamping force of 2 kN to keep the layers flat and assist with diffusion of components at high temperature. Application of clamping force was deemed necessary as the adhesion without applying the clamping force was found to be weak and the interfaces separated during metallographic preparation for SEM analysis. The rig was then placed in a tube furnace, which was sealed and held under vacuum to a pressure of approximately 20 μTorr (0.0026 Pa). Vacuum was used to minimize the formation of oxides within the bond layer, when the temperatures within the structure were high. The temperature was increased to 530° C. in 40 minutes and was held for 30 minutes. In the next step, it was increased to 565° C. within 15 minutes and was held for 40 more minutes. Afterwards, the power was turned off allowing the rig to cool naturally to ambient. The hold time at 530° C. (30 minutes) was used to allow the Cu to diffuse into the Al before reaching the melt temperature. In this way, when the melt temperature was finally reached, the bond would melt more homogenously as opposed to melting at a small interface layer first, and the liquid layer slowly growing. The hold time of 30 minutes for this step was determined by using Eqs. (1) and (2) using a finite difference calculation explained as follows.

The solid-state diffusion of Cu is governed by Fick's second law given by Eq. (1).

$$\frac{dC}{dt} = D\frac{d^2C}{dx^2} \quad (1)$$

Figure 3:
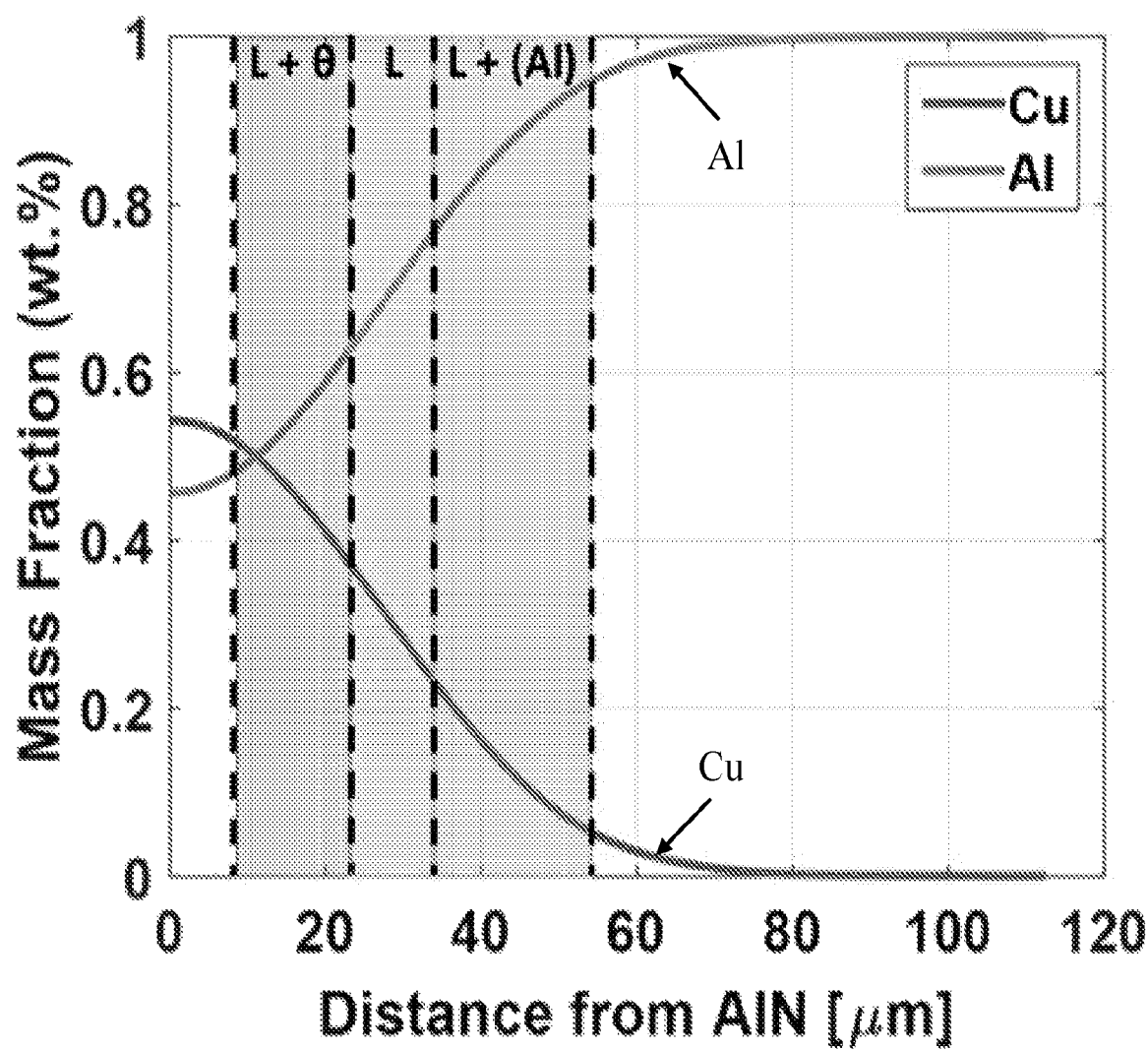
FIG. 3 depicts a composition profile through the Al—Cu eutectic.

In this equation, C is the concentration, D is the diffusion coefficient, t is time, and x is the spatial dimension, which is the thickness of the layers in a 1-D format. The diffusion coefficient is dependent on the two diffusing materials, and is a function of time given by Eq. (2):

$$C_d = C_0 e^{\frac{-Q_d}{RT}} \quad (2)$$

where $C_o$ is a material constant, ($6.5 \times 10^{-5} m^2 s^{-1}$ for the Al—Cu system), $Q_d$ is the activation energy for diffusion, (136 kJ mol$^{-1}$ for the Al—Cu system), R is the universal gas constant, and T is the temperature. As $C_d$ exponentially increases with T, it is clear that at high temperatures diffusion speed increases rapidly. By modeling the Al—Cu system with these equations, an estimate for the required diffusion time before melting occurred was determined. For the models a time step of 0.001 s, and a spatial step size of 0.1 μm were applied, with the diffusion coefficient recomputed for each temperature. The process temperature was decided to be 530° C. to avoid possible overshoot into the liquid regime before diffusion was complete, while also being high enough to allow for rapid diffusion. While this process temperature may seem high, it is substantially lower than the 1074° C. processing temperature used to bond DBC. Applying this temperature profile to the numerical model resulted in a final composition profile through the Cu and Al layer as shown in FIG. 3.

According to this result, at the time when the temperature reached 565° C., approximately 35 μm of the bond thickness turned to mostly liquid. This pre-diffusion step provides advantages over simply increasing to the melt temperature immediately. First, by decreasing the amount of liquid, which formed at one time, the effect of leakage was reduced. Here, leakage means liquid metal attempting to escape the graphite rig, due to applied pressure on the layers and vacuum in the furnace. The early liquid composition had a high Cu content, so if a thin liquid interface layer leaked, it would take a disproportionately large amount of Cu with it.

The sample was removed from the furnace, when it reached ambient temperature. In order to prepare the sample for SEM imaging, its edges were polished and cleaned with sonication for 30 minutes.

Example 2: Bond Testing: Scanning Electron Microscopy (SEM) and Energy-Dispersive X-ray Spectroscopy (EDS)

Figure 4:
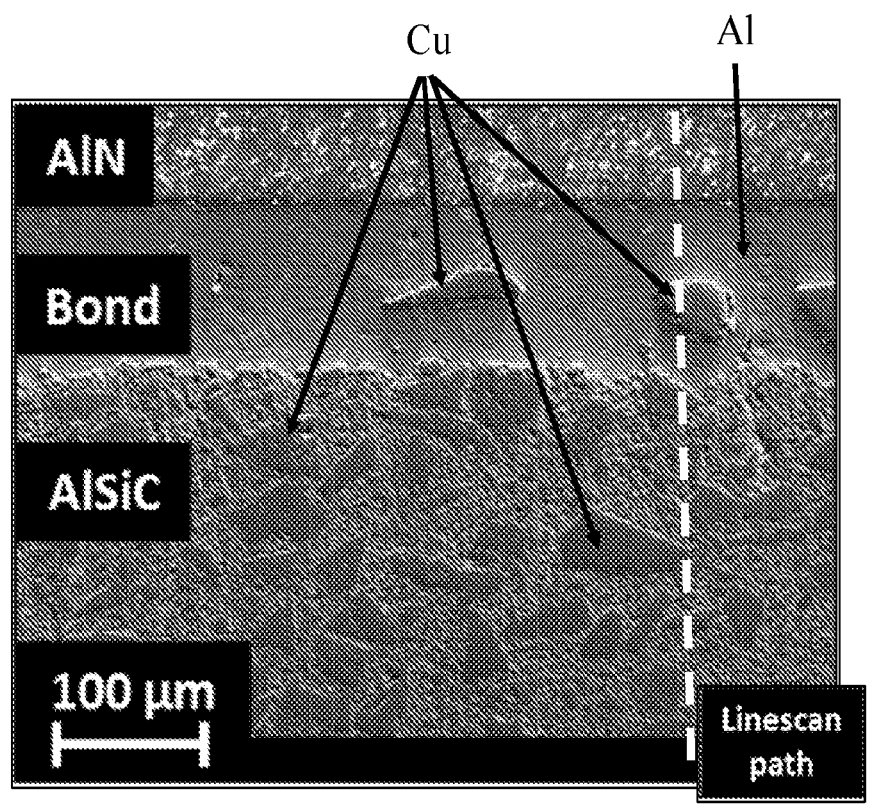
FIG. 4 depicts scanning electron microscopy and energy-dispersive X-ray spectroscopy imaging of the bonds of an embodiment of the power electronics module.

SEM was used to image the bond between the AlN and the AlSiC, while EDS was used to determine the bond composition quantitatively. As shown in FIG. 4, an unexpected result revealed that some of the SiC particles migrated into the bond showing that the TLP bond reacted with the AlSiC plate and the liquid layer allowed SiC to freely move. This resulted in the formation of a metal matrix composite bond, which is different from other TLP methods shown for joining AlN and Al. By evaluating SEM images at several locations across the bond, it was found that the average bond thickness was 140 μm, which is greater than the initial starting Al—Cu layers used to initiate the bond (~100 μm thick). Using the EDS image the composition of the bond area was found to be 93.0% Al, 0.6% C, 1.5% Cu, 0.3% N, 1.7% O, and 2.8% Si by weight.

Using the binary phase diagram in FIG. 2 with 1.5% Cu, the ratio of the θ phase or $CuAl_2$ was estimated to be 2.8%, with Al+Cu+Si being 97.2% by weight. This differs significantly from the estimation based only on the materials in the intermediate layers only (77.9% Al, 20.2% Cu, and 1.9% Si by weight). This difference is due to the exclusion of the Al in Al-356 of the AlSiC matrix, which accounts for 37% of the bulk 3 mm thick AlSiC, the rest being SiC. It must be noted that the initial composition and associated calculations were made to analyze the diffusion of Cu in Al just to ensure that before completely melting the Al—Cu bulk interlayer, sufficient cross diffusion of elements has occurred. The revised estimate of composition is a result of solid-state diffusion as well as liquid interlayer interacting with the AlSiC. Including this amount of Al in AlSiC, the estimation becomes 92.9% Al, 1.3% Cu, and 5.8% Si by weight. This composition is now similar to the mass fractions measured with EDS, implying that melting occurred deeply within the AlSiC matrix. Through EDS imaging of the backside of the AlSiC, trace amount of Cu was confirmed, which corroborated the important inference that Al in the AlSiC matrix takes part in bonding and Cu diffused deep into AlSiC matrix. While the migration of SiC particles in the bond material are suggestive of the same conclusion, their presence in the bond is expected to avoid the bond flowing plastically at elevated temperatures and locally enhance the thermal conductivity, as $k_{SiC}$ is of the same order as that of pure Cu.

Figure 5:
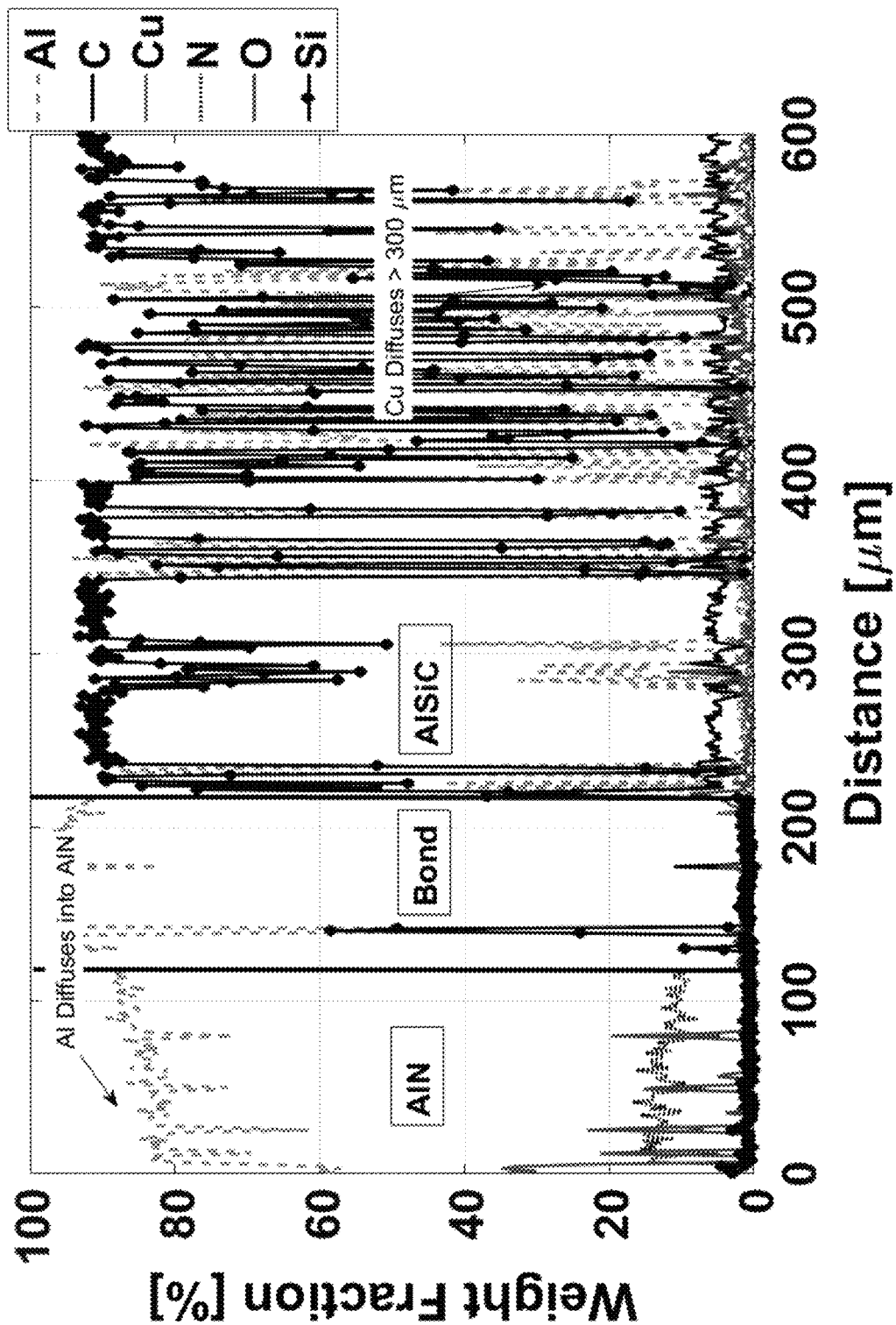
FIG. 5 depicts further analysis of the diffusion properties of the bonding material.
Figure 5:
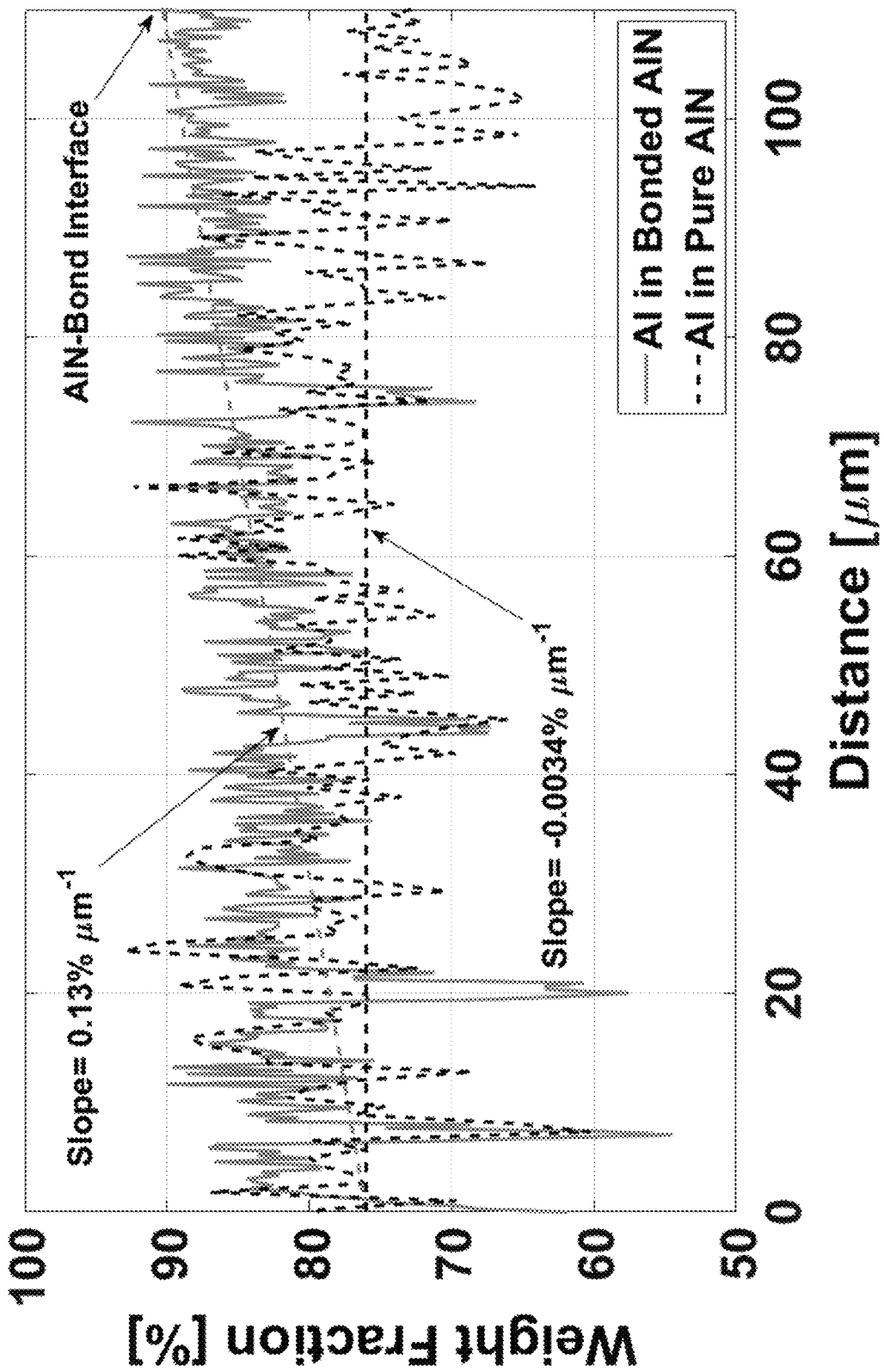

In order to track the diffusion of different species through the depth of the bond, an EDS linescan was used as shown in FIG. 5. This measurement was performed at several different locations, but only one representative location is shown, as all scans had similar results. The SiC particles are indicated in FIG. 5 by the spikes in Si within the AlSiC layer, which was known because of the simultaneous spikes in carbon. However, this particular Si spike in the bond region was not accompanied by a spike in carbon. It means that it was from the Al 356 alloy. Another unexpected observation was the diffusion of Al metal into an AlN crystal structure as the 1:1 molar ratio (Al:N) should have remained constant. Therefore, this was investigated further by analysis of pure AlN not used in bonding and the results are compared in FIG. 5.

The Al concentration within the pure AlN sample can be seen in FIG. 5 to be constant through the AlN with almost zero slope of the Al concentration. However, the bonded AlN sample clearly shows an increase in the Al concentration closer to the AlN-Bond interface with a 25 times larger slope than the un-bonded sample. This confirmed that the Al was found into the AlN substrate. This migration was thought to have occurred because AlN substrates are manufactured by sintering AlN particles together using a yttria ($Y_2O_3$) additive to reduce the processing temperature and aid in densification. Therefore, there were grain boundaries and voids within the AlN, which the molten bond material was able to fill. Although this is advantageous for the bond strength by improving adhesion, Al metal diffusing deep into the AlN can potentially affect the dielectric properties of AlN. Therefore, it was necessary to evaluate the dielectric strength of AlN to ensure that the bonding process does not compromise it.

Example 3: Dielectric Strength Testing

In order to test the dielectric strength, two copper electrodes were attached to either side of the bonded sample with copper tape. A voltage was then applied and increased, until current began to flow through the AlN. Because the dielectric breakdown strength of air was much less than the AlN, the sample needed to be submerged in a dielectric fluid. Therefore, Fluorinert (FC-72) from 3M, a dielectric fluid with a strength of 15 kV $mm^{-1}$ was used. As the electrodes were placed at about 5 mm from the edges of the sample, the FC-72 had a total blocking voltage of approximately 150 kV. While submerged, the AlN began to conduct electricity at 18 kV, leading to a dielectric strength of 17.7 kV $mm^{-1}$ for an AlN substrate with a thickness of 1.02 mm. The test was then repeated with an un-bonded sample of AlN, and as expected, dielectric breakdown occurred at 18 kV. This value was also consistent with the AlN manufacturer specified value of 17 kV $mm^{-1}$ for the dielectric strength. These tests conducted on multiple samples confirmed that neither the bonding process nor the leakage of Al into the AlN grains reduces the dielectric strength of the AlN after bonding and occurrence of Al in AlN was predominately a function of surface roughness of AlN.

Figure 6:
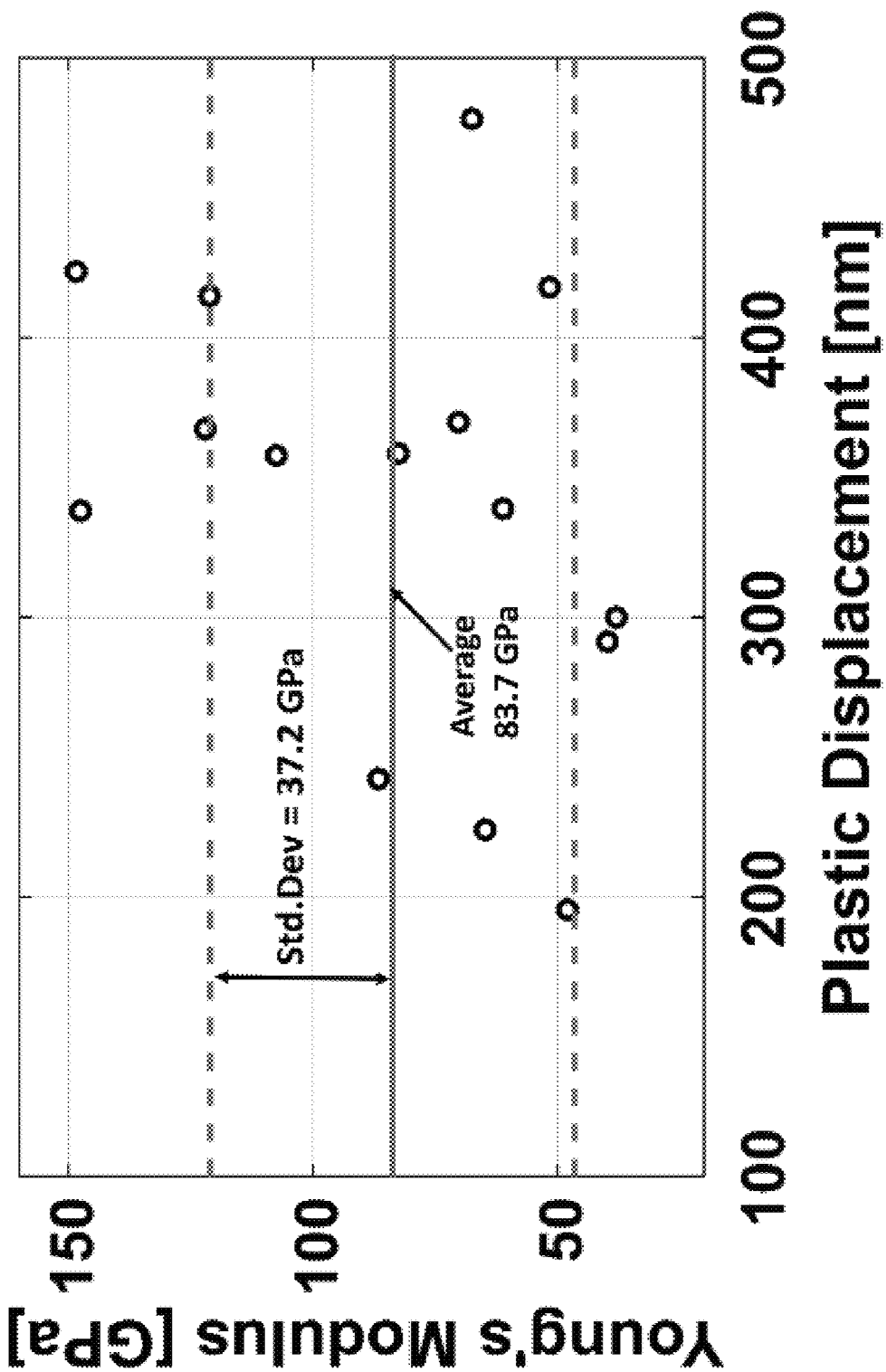
FIG. 6 depicts a plot displaying the mechanical behavior of an embodiment of the power module.
Figure 6:
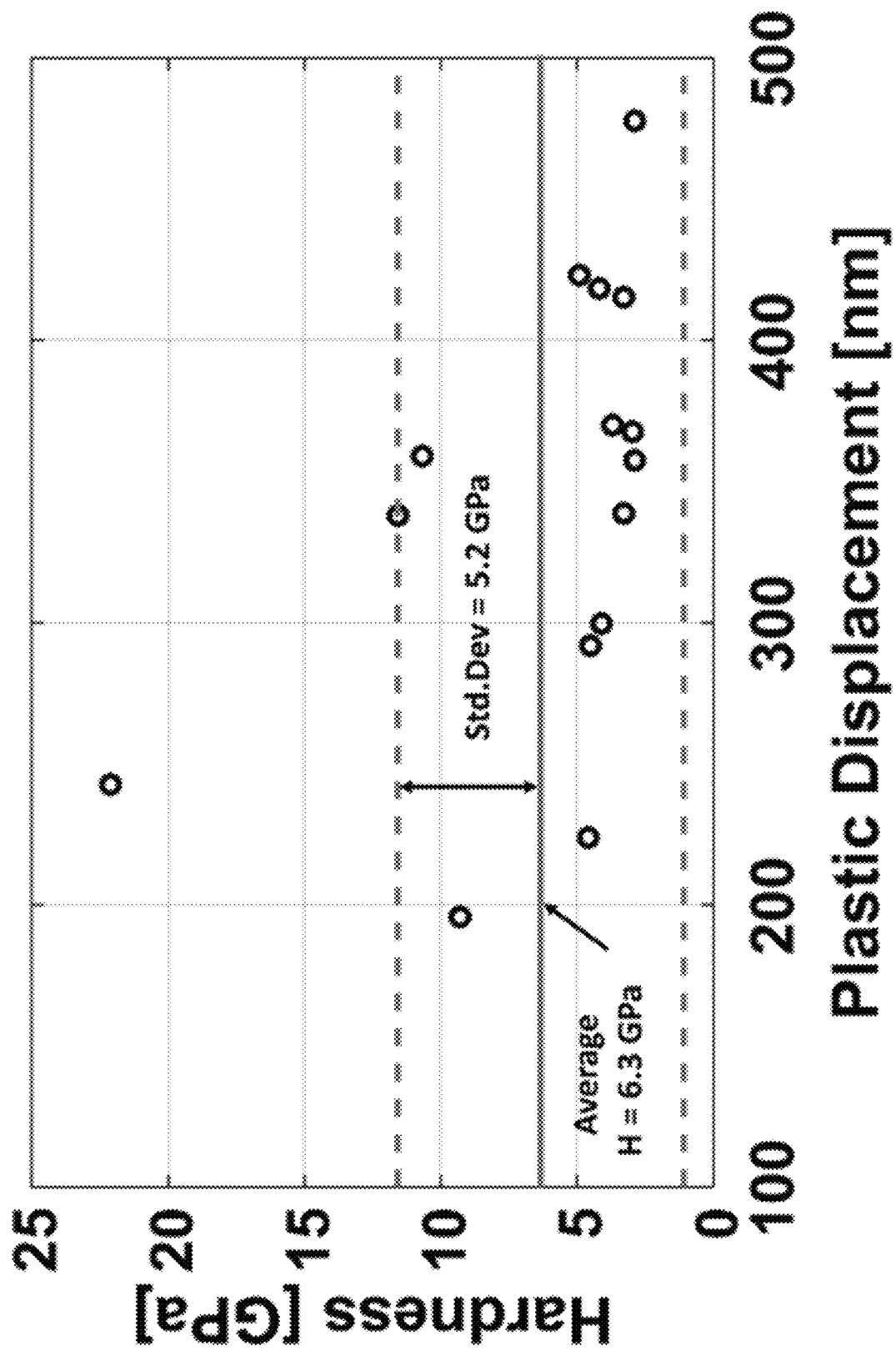

Example 4: Young's Modulus and Hardness Testing to Show the Mechanical Behavior of the Bonding Material The hardness (H) and the Young's modulus (E) were both measured with a diamond tipped nanoindenter (Hysitron Ti 900 Triboindenter) that was calibrated with fused silica. The calibration was performed over a range of 0 to 600 nm indentation distance, encompassing the full range of 0 to 500 nm, which was displaced by the bond material. In order to test the properties of the bond material alone, a new sample was made with the AlSiC substrate coated with Al and Cu, but without the AlN layer. Thus, the equivalent material composition was produced, but there was a larger area to access the bond material. After sample fabrication, the topside of the bond material was polished with the same procedure used to prepare the sample for SEM imaging. To extract E and H of the bond material, nine indentations per run in a 90 by 90 μm grid array were made. For each indentation, a loading/unloading curve was generated, and values of E and H were extracted and plotted in FIG. 6.

When compared to pure Al, which has an E value of 75 GPa, the bond material is slightly more rigid. This is possibly due to the bond being a mixture of Al and the θ phase, ($CuAl_2$), which has modulus of 120 GPa. Another cause could have been the SiC particles near the surface, which have a modulus of 410 GPa, and could have aided in resistance to elastic deformation. The large standard deviation in the data was also attributed to the SiC particles, which on the length scale of 90 μm of the area chosen for observation, are not uniformly distributed beneath the surface. Each SiC particle could be as large as 80 μm or as small as 1 μm.

The hardness of the bond was measured to be 6.3 GPa, and was significantly larger than the hardness of Al of 0.5 GPa. However, the value was also much smaller than the hardness of SiC, being 28 GPa and greater than the typical values of the hardness for Sn—Ag—Cu solders of 2 GPa.

The increase in hardness was due to precipitate hardening, which introduced precipitates, (the 2.8% θ phase), into the matrix to obstruct the movement of dislocations. Since the hardness is a measure of the materials resistance to permanent plastic deformation, this increase implies this bond would be much more resistant to permanent deformation than a pure Al bond or even conventional solders. The hardness also had a large standard deviation, which again could be due to the SiC particles spread non-uniformly beneath the surface.

Another important thermo-physical property of the bond is the thermal conductivity as this parameter dominates the thermal transport abilities of the material. It was measured with a laser flash diffusivity technique. Laser flash diffusivity is a transient heat flow measurement, wherein one side of a sample absorbs a short laser pulse, while the temperature change on the other side is monitored. This temperature change as a function of time can then be fitted to analytical models to compute the thermal diffusivity of the material.

In order to determine the thermal diffusivity and in turn the thermal conductivity of the bond material, the thermal diffusivity of both the AlN and AlSiC were first measured with the laser flash diffusivity method using the Hyperflash system. All samples were coated with a thin graphite layer (up to 10 μm) to increase the emissivity of the surface. The sample holder was made of insulating ABS plastic to reduce the heat loss at the edges. The experiment was conducted in a vacuum-sealed chamber held at 25° C. to eliminate variation from ambient temperature changes. For the single layer materials, thermal diffusivity was computed. The bonded samples were then measured the same way, and using the measured thermal diffusivity for pure AlN, and pure AlSiC; the thermal diffusivity of the bond layer was determined. The flash was repeated three times and an average thermal diffusivity is reported. The material thermal diffusivity, density, heat capacity, and thermal conductivity are reported in Table 1. The density of the bond was computed as the weighted average between the density of Al, 2700 kg/m³, and the density of $CuAl_2$, 4400 kg/m³, using the estimated ratio of 97.2% Al, and 2.8% $CuAl_2$, estimated from the EDS analysis earlier. The effective thermal conductivity value of the bondline was found to be 121.2±5.3 W m$^{-1}$K$^{-1}$, which is about two times better than typical solders and about a 100 times better than standard TIM materials.

TABLE 1

Thermo-physical properties of the substrate materials.

| Material | Thermal Diffusivity (m² s$^{-1}$) | Density (kg m$^{-3}$) | Specific Heat (J kg$^{-1}$ K$^{-1}$) | Effective Thermal Conductivity (W m$^{-1}$ K$^{-1}$) |
|---|---|---|---|---|
| AlSiC | 7.94 × 10$^{-5}$ ± 2.1 × 10$^{-7}$ | 2870 | 741 | 168.8 ± 0.5 |
| AlN | 6.47 × 10$^{-5}$ ± 2.0 × 10$^{-5}$ | 3260 | 740 | 156.1 ± 0.5 |
| Bond | 5.17 × 10$^{-5}$ ± 2.3 × 10$^{-5}$ | 2750 | 853 | 121.2 ± 5.3 |

Example 5: Thermal Conductivity Testing

The thermal conductivity of the bond material was also measured using a Time-Domain Thermoreflectance (TDTR) approach. The sample used for nanoindentation tests was used for TDTR measurements and was coated with Al layer of 80 nm thick after fine polishing. The thermal conductivity of the bond material was found to be 133±12 W m$^{-1}$K$^{-1}$ and was slightly higher than the effective thermal conductivity of the bondline (121.2 W m$^{-1}$K$^{-1}$). This is possible because, the Laser Flash diffusivity measurement also included the contact resistance of the bond and effect of voids. Nevertheless, it should be noted that the effective thermal conductivity and the material thermal conductivity of this bond layer was higher than that of most solders (≈50 W m$^{-1}$K$^{-1}$) and thus is expected to provide a lower thermal resistance than if materials such as AuSn were used to join the AlN and AlSiC.

Example 6: Thermal Performance Testing

Once the thermal conductivity of the bond material was determined, thermal modeling and heat spreading analysis was conducted to assess the performance of the new TLP bond in comparison with the DBC-based stacking. A section of Toyota Prius inverter geometry was selected for this study. The complete package dissipates 2400 W of heat using 12 pairs of an IGBT and a diode. Due to symmetry conditions and to save computational cost, heat transfer in two pairs in an identical section of the total package was simulated. Additionally, instead of applying the convection boundary condition at the backside of the base plate, fluid modeling was incorporated in the simulations. The coolant used for simulations was water—ethylene glycol (50/50).

Minichannel geometry was determined to provide better heat transfer coefficient than pin fins and spray cooling for a fixed given coolant pumping power. The summary of the fluid flow modeling and boundary conditions adapted in the present work are shown in Table 2. These conditions are applied exactly to different stacking configurations for comparison of thermal performance between the TLP bond-AlSiC configuration and DBC-AlSiC configuration.

TABLE 2

Fluid boundary conditions and channel geometry details selected for modeling the heat spreading and removal.

| Parameter | Value |
|---|---|
| Total heat dissipated | 400 W |
| IGBT heat flux | 120 W cm$^{-2}$ |
| Diode heat flux | 95 W cm$^{-2}$ |
| Coolant | Water - ethylene glycol |
| Coolant density | 999 kg m$^{-3}$ |
| Coolant specific heat | 3820 J kg$^{-1}$ K$^{-1}$ |
| Coolant conductivity | 0.391 W m$^{-1}$ K$^{-1}$ |
| Coolant viscosity | 0.0011N s$^{-1}$ m$^{-1}$ |
| Coolant Pumping power | 8 W |
| Coolant mass flow rate | 0.2 kg s$^{-1}$ |
| Square minichannel side | 2 mm |
| Coolant inlet temperature | 80° C. |
| Si thickness, IGBT | 510 μm |
| Si thickness, Diode | 320 μm |
| Solder thickness | 100 μm |
| Cu layer thickness | 300 μm |
| AlN thickness | 630 μm |
| Bond thickness | 140 μm |
| AlSiC thickness | 3 mm |

The computational model was developed and meshed in ANSYS ICEMCFD and simulated in ANSYS FLUENT™. Grid independence was ensured and the conservation equations were solved until they converged within 0.5%.

The device temperature was greater for the TLP bond-based system than the DBC-based stack by 3° C., as $\Delta T_{Max}$ for the DBC stack was 33° C., while that with the TLP bond was 36° C. This increase was because of removal of the Cu layer at the bottom of the AlN in the DBC, which aided in heat spreading directly below AlN. The bond material thermal conductivity of 121.2 W m$^{-1}$K$^{-1}$ indicates its standalone thermal performance, however the device temperature depends heavily on how fast and efficiently heat is spread after it leaves the device. The bottom Cu layer in the DBC helps in spreading heat more effectively after it leaves AlN in the lateral direction. This is not the case with the thin AlSiC bond (100 μm) with a thermal conductivity of 121.2 W m$^{-1}$K$^{-1}$, replacing the thick Cu layer (300 μm) and a thermal conductivity of 401 W/m-K. While the linear thermal resistance between the device and the heat sink with this bond decreases as compared to that with DBC, yet heat spreading is marginally affected due to removal of the DBC Cu layer.

Simultaneous modifications in the heat flux input and cooling methods yielded the exact temperature difference between devices for these two configurations, hence a comparative parametric study was not required. Despite the fact that DBC-based stack yielded marginally better device temperature for the same pumping power, the TLP bond stack is expected to provide a better fatigue and reliability performance. This is because as a Cu layer with a CTE of 16 ppm ° C.$^{-1}$ is removed and is replaced by a TLP bond that has more favorable mechanical properties as previously described.

Example 7: Fatigue and Thermal Stress Testing

Multiple samples were tested for observation of thermal stresses at interfaces. Multiple samples were tested for fatigue tests cycling from −40° C. and 150° C. with a heating and cooling rate of 5° C./min and aging tests were conducted at 150° C. These test parameters are based on JEDEC Standard Temperature Cycling—Standard JESD22-Al04D, which is a widely accepted set of fatigue cycle parameters to evaluate the reliability of the substrate—baseplate attach materials. All samples showed no change in void fraction even after 1400 fatigue cycles and 1400 hours of aging tests, without any question of delamination. Comparing this performance with that of the DBC failing at as early as 100 cycles, it can be safely concluded that the AlN—AlSiC configuration yields much superior mechanical performance than the DBC-based power packages.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based can be readily used as a basis for the design of other structures, methods, and systems for carrying out the several purposes of the embodiments and claims presented in this application. It is important, therefore, that the claims be regarded as including such equivalent constructions.

What is claimed is:

1. A method of manufacturing a power electronic module comprising:
   bonding amorphous AlN having a thickness of from about 0.4 mm to 1 mm and a heat sink via an interlayer material;
   wherein the thermal conductivity of the interlayer material is at least 69% of each of the thermal conductivities of the amorphous AlN and the heat sink.

2. The method of claim 1, wherein the heat sink is AlSiC.

3. The method of claim 1, wherein bonding comprises transient liquid phase bonding.

4. The method of claim 1, wherein the heat sink comprises AlSiC; and
   wherein the interlayer material is a bonding material comprising a transient liquid phase bonded alloy.

5. The method of claim 1, wherein the interlayer material is an Al—Cu eutectic.

6. A method of manufacturing a power electronic module comprising:
   heating a mold containing a pre-heating thickness of a heat sink, a pre-heating thickness of an interlayer material, and a pre-heating thickness of a dielectric substrate to a first temperature being a diffusion temperature of the interlayer material; and
   heating the mold to a second temperature being a melt temperature of the interlayer material;
   wherein the melt temperature is higher than the diffusion temperature; and
   wherein the interlayer material and the pre-heating thickness of the interlayer material comprising a foil of aluminium having a thickness of from about 0.03 mm to 1 mm and a foil of copper having a thickness of from about 0.01 mm to 0.02 mm.

7. The method of claim 6, wherein the interlayer material comprises about 17 wt % Cu and 81 wt % Al.

8. The method of claim 6, wherein the area of the manufactured power electronic module is from about 50 mm by about 50 mm.

9. The method of claim 6, wherein the pre-heating thickness of the dielectric substrate is from about 0.4 mm to 1 mm.

10. The method of claim 6, wherein the pre-heating thickness of the heat sink is from about 2.5 mm to 5 mm.

11. The method of claim 6, wherein upon a completion of the manufacture of the power electronic module, the interlayer material thickness between the dielectric substrate and the heat sink is greater than the pre-heating thickness of the interlayer material.

12. The method of claim 1, wherein upon a completion of the manufacture of the power electronic module:
   the thermal conductivity of the amorphous AlN is about 156.1±0.5 W m$^{-1}$K$^{-1}$;
   the thermal conductivity of the heat sink is about 168.8±0.5 W m$^{-1}$K$^{-1}$; and
   the thermal conductivity of the interlayer material is about 133±12 W m$^{-1}$K$^{-1}$.

13. The method of claim 6, wherein:
   the dielectric substrate comprises an AlN ceramic;
   the heat sink comprises an AlSiC base plate having a cover layer of Al 356 alloy from about 50 to 80 μm thick; and
   the interlayer material comprises Al and Cu in about a 5:1 (Al:Cu) weight ratio.

14. The method of claim 6, wherein depositing the interlayer material is prior to either heating step, and comprises depositing one or more bonding materials having a total pre-manufacture thickness;
   wherein upon a completion of the manufacture of the power electronic module, the average bond thickness between the dielectric substrate and the heat sink is greater than the total pre-manufacture thickness.

15. The method of claim 6, wherein heating the mold to the first temperature comprises heating the mold at about 530° C. and holding the temperature to about 530° C. for a diffusion time; and
wherein heating the mold to the second temperature comprises heating the mold to about 565° C. and holding the temperature at about 565° C. for a melting time.

16. The method of claim 15, wherein the diffusion time is about 30 minutes; and
wherein the melting time is about 40 minutes.

17. A method of manufacturing a power electronic module comprising:
bonding a dielectric substrate and a heat sink via an interlayer material;
wherein the interlayer material comprises about 17 wt % Cu and 81 wt % Al; and
wherein the thermal conductivity of the interlayer material is at least 69% of each of the thermal conductivities of the dielectric substrate and the heat sink.

18. The method of claim 17, wherein the dielectric substrate is AlN.

19. The method of claim 17, wherein the heat sink is AlSiC.

20. The method of claim 17, wherein bonding comprises transient liquid phase bonding.

21. The method of claim 17, wherein the dielectric substrate comprises AlN; and
wherein the heat sink comprises AlSiC.

22. The method of claim 17, wherein the dielectric substrate is amorphous AlN.

23. The method of claim 17, wherein bonding comprises:
heating a mold containing the heat sink, the interlayer material, and the dielectric substrate to a first temperature being a diffusion temperature of the interlayer material; and
heating the mold to a second temperature being a melt temperature of the interlayer material;
wherein the melt temperature is higher than the diffusion temperature.

24. A method of manufacturing a power electronic module comprising:
bonding a dielectric substrate and a heat sink via an interlayer material;
wherein the thermal conductivity of the interlayer material is at least 69% of each of the thermal conductivities of the dielectric substrate and the heat sink;
wherein the dielectric substrate comprises an AlN ceramic;
wherein the heat sink comprises an AlSiC base plate having a cover layer of Al 356 alloy from about 50 to 80 μm thick; and
wherein the interlayer material comprises Al and Cu in about a 5:1 (Al:Cu) weight ratio.

25. A method of manufacturing a power electronic module comprising:
heating a mold containing a pre-heating thickness of a heat sink, a pre-heating thickness of an interlayer material, and a pre-heating thickness of a dielectric substrate to a first temperature being a diffusion temperature of the interlayer material; and
heating the mold to a second temperature being a melt temperature of the interlayer material;
wherein the melt temperature is higher than the diffusion temperature; and
wherein upon a completion of the manufacture of the power electronic module, the interlayer material thickness between the dielectric substrate and the heat sink is greater than the pre-heating thickness of the interlayer material wherein the interlayer material comprises Al and Cu in about a 5:1 (Al:Cu) weight ratio.

26. A method of manufacturing a power electronic module comprising:
selecting a dielectric substrate comprising an AlN ceramic;
selecting a heat sink heat sink comprising an AlSiC base plate having a cover layer of Al 356 alloy from about 50 to 80 μm thick;
selecting an interlayer material comprising Al and Cu in about a 5:1 (Al:Cu) weight ratio; and
bonding the dielectric substrate and the heat sink via the interlayer material;
wherein the thermal conductivity of the interlayer material is at least 69% of each of the thermal conductivities of the dielectric substrate and the heat sink.

27. The method of claim 2, wherein the interlayer material comprises the θ phase ($CuAl_2$).

28. The method of claim 2, wherein the interlayer material comprises about 2.8% wt % of the θ phase ($CuAl_2$).

29. The method of claim 2, wherein the interlayer material has a hardness of about 6.3 GPa.

30. The method of claim 2, wherein the interlayer material has a density of about 2750 kg m$^{-3}$.

31. The method of claim 6, wherein the dielectric substrate comprises AlN;
wherein the heat sink comprises AlSiC; and
wherein the interlayer material comprises the θ phase ($CuAl_2$).

32. The method of claim 6, wherein the dielectric substrate comprises AlN;
wherein the heat sink comprises AlSiC; and
wherein the interlayer material comprises about 2.8% wt % of the θ phase ($CuAl_2$).

33. The method of claim 6, wherein the dielectric substrate comprises AlN;
wherein the heat sink comprises AlSiC; and
wherein the interlayer material has a hardness of about 6.3 GPa and a density of about 2750 kg m$^{-3}$.

* * * * *